(12) United States Patent  
Chang et al.

(10) Patent No.: US 9,412,851 B2
(45) Date of Patent: Aug. 9, 2016

(54) METHOD FOR FABRICATING SEMICONDUCTOR DEVICE INCLUDING A PATTERNED MULTI-LAYERED DIELECTRIC FILM WITH AN EXPOSED EDGE

(71) Applicant: UNITED MICROELECTRONICS CORP., Hsin-Chu (TW)

(72) Inventors: Yu-Chun Chang, Taichung (TW); Ping-Chia Shih, Tainan (TW); Chi-Cheng Huang, Kaohsiung (TW); Kuo-Lung Li, Yunlin County (TW); Kun-I Chou, Tainan (TW); Chung-Che Huang, Tainan (TW); Chia-Cheng Hsu, Tainan (TW); Mu-Jia Liu, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 24 days.

(21) Appl. No.: 14/138,153

(22) Filed: Dec. 23, 2013

(65) Prior Publication Data

US 2015/0179748 A1 Jun. 25, 2015

(51) Int. Cl.
| | |
|---|---|
| *H01L 21/3205* | (2006.01) |
| *H01L 21/4763* | (2006.01) |
| *H01L 29/66* | (2006.01) |
| *H01L 27/115* | (2006.01) |

(52) U.S. Cl.
CPC ...... *H01L 29/66833* (2013.01); *H01L 27/1157* (2013.01); *H01L 27/11573* (2013.01)

(58) Field of Classification Search
None
See application file for complete search history.

(56) References Cited

U.S. PATENT DOCUMENTS

| | | | |
|---|---|---|---|
| 6,794,219 B1* | 9/2004 | Stevens | H01L 21/2652 257/E21.337 |
| 2002/0151133 A1* | 10/2002 | Chen et al. | 438/244 |
| 2004/0197995 A1* | 10/2004 | Lee et al. | 438/257 |
| 2005/0148137 A1* | 7/2005 | Brask et al. | 438/216 |
| 2005/0233523 A1* | 10/2005 | Wu et al. | 438/264 |
| 2005/0285184 A1* | 12/2005 | Jung | 257/324 |
| 2006/0131672 A1* | 6/2006 | Wang | H01L 21/28202 257/410 |
| 2007/0166904 A1* | 7/2007 | Teo et al. | 438/197 |
| 2010/0112799 A1* | 5/2010 | Jeong | 438/591 |
| 2010/0181620 A1* | 7/2010 | Booth, Jr. | H01L 21/28282 257/350 |
| 2011/0062527 A1* | 3/2011 | Shino | H01L 21/823814 257/369 |
| 2011/0211394 A1* | 9/2011 | Scheiper et al. | 365/185.18 |
| 2014/0227843 A1* | 8/2014 | Tsukamoto et al. | 438/275 |

* cited by examiner

*Primary Examiner* — Mohammad Islam
*Assistant Examiner* — Jay C Chang
(74) *Attorney, Agent, or Firm* — Winston Hsu; Scott Margo

(57) ABSTRACT

A method for fabricating a semiconductor device includes forming a patterned multi-layered dielectric film on a substrate; forming a patterned stack on the patterned multi-layered dielectric film so that an edge of the patterned multi-layered dielectric film is exposed from the patterned stack; forming a cover layer to cover a part of the substrate and expose the patterned stack and the exposed edge of the patterned multi-layered dielectric film; removing at least a part of the exposed edge of the patterned multi-layered dielectric film by using the cover layer and the patterned stack as an etching mask; and performing an ion implantation process by using the cover layer as an etching mask so as to form a doped region.

12 Claims, 5 Drawing Sheets

METHOD FOR FABRICATING SEMICONDUCTOR DEVICE INCLUDING A PATTERNED MULTI-LAYERED DIELECTRIC FILM WITH AN EXPOSED EDGE

BACKGROUND OF THE INVENTION

1. Field of the Invention

The present invention generally relates to the field of semiconductors devices, and more particularly to a method for fabricating a semiconductor device having memory devices.

2. Description of the Prior Art

A flash memory is a non-volatile memory, which can preserve data within the memory even when an external power supply is off. Recently, since flash memories are re-writable and re-erasable, they have been widely utilized in the electrical products, such as mobile phones, digital cameras, video players, personal digital assistants (PDA) or systems on a chip (SOC).

Generally, a flash memory is composed of several flash memory cells. Each of the flash memory cells may include at least a control gate (CG) and a select gate (SG) disposed on a substrate. Precisely, in order to enhance the performance of the flash memory, there may be a metal silicide layer disposed at the surface of the substrate between the control gate and the select gate. However, since an electron trapping layer, such as a silicon oxide-silicon nitride-silicon oxide (ONO) layer, of the control gate often extends from the bottom of the control gate to the space between the control gate and the select gate, metal elements used to form the metal silicide layer are often blocked by the electron trapping layer during the formation of the metal silicide layer. Therefore, the metal silicide layer is usually non-uniformly distributed at the surface of the substrate between the control gate and the select gate. Consequently, how to overcome this problem is still an important issue in the field, in order to improve the performances of the flash memory cell.

SUMMARY OF THE INVENTION

One object of the present invention is therefore to provide a method for fabricating a semiconductor device in order to avoid the above-described drawback.

According to one exemplary embodiment of the present invention, a method for fabricating a semiconductor device is provided and includes the following steps. First, a patterned multi-layered dielectric film is formed on a substrate. Then, a patterned stack is formed on the patterned multi-layered dielectric film and an edge of the patterned multi-layered dielectric film is exposed from the patterned stack. A cover layer is formed to cover a part of the substrate and expose the patterned stack and the exposed edge of the patterned multi-layered dielectric film. Afterwards, at least apart of the exposed edge of the patterned multi-layered dielectric film is removed by using the cover layer and the patterned stack as an etching mask. Finally, an ion implantation process is performed by using the cover layer as an etching mask so as to forma doped region.

One main characteristic of the embodiment is that the exposed edge of the patterned multi-layered dielectric film is removed before the formation of a metal silicide. In this way, the metal silicide may be formed uniformly on the surface of the doped region so as to improve the performance of the semiconductor device.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
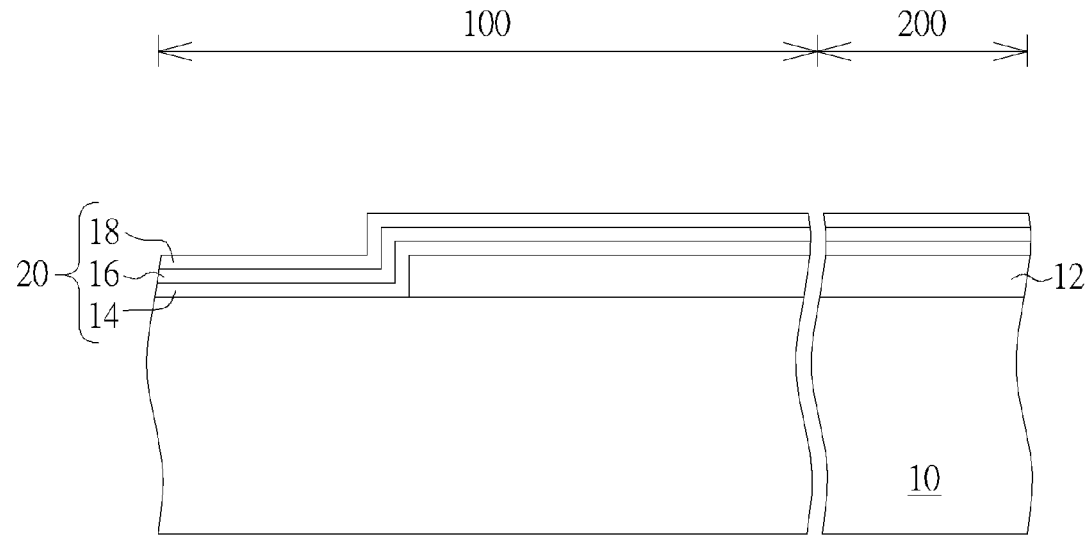
FIG. 1 to FIG. 9 are schematic diagrams showing a method for fabricating a semiconductor device according to one exemplary embodiment of the present invention.

In the following description, numerous specific details are given to provide a thorough understanding of the invention. It will, however, be apparent to one skilled in the art that the invention may be practiced without these specific details. Furthermore, some well-known system configurations and process steps are not disclosed in detail, as these should be well-known to those skilled in the art.

Likewise, the drawings showing embodiments of the apparatus are not to scale and some dimensions are exaggerated for clarity of presentation. Also, where multiple embodiments are disclosed and described as having some features in common, like or similar features will usually be described with same reference numerals for ease of illustration and description thereof.

Please refer to FIG. 1 to FIG. 9. FIG. 1 to FIG. 9 are schematic diagrams showing a method for fabricating a semiconductor device according to one exemplary embodiment of the present invention. Referring to FIG. 1, a semiconductor substrate 10 is provided at the beginning. The substrate 10 may be divided into at least two regions, for example, a first region 100 and a second region 200. According to one embodiment of the present invention, the first region 100 and the second region 200 may respectively correspond to a memory region and a logic region. More preferably, the memory region is a non-volatile memory region used to accommodate non-volatile memory devices and the logic region is used to accommodate logic devices, but not limited thereto. Then, a patterned pad layer 12 is formed on the substrate 10 within the first region 100 and the second region 200. Precisely, the patterned pad layer 12 may cover portions of the substrate 10 within the first region 100 and cover the entire substrate 10 within the second region 200. After the formation of the patterned pad layer 12, a multi-layered dielectric film 20 is formed on the substrate 10 and conformally covers the underlying patterned pad layer 12. Precisely, the multi-layered dielectric film 20 is composed of at least three dielectric layers, for example, a bottom dielectric layer 14, a middle electron trapping layer 16, and a top dielectric layer 18 from bottom to top. It should be noted that, the number of layers of the multi-layered dielectric film 20 is not restricted to be three and may be increased or decreased according to different requirements.

The above-mentioned substrate 100 may be selected from a silicon substrate, a silicon-germanium substrate or a silicon-on-insulator (SOI) substrate, but not limited thereto. The patterned pad layer 12 may be made of silicon oxide. Preferably, the bottom dielectric layer 14, the middle electron trapping layer 16, and the top dielectric layer 18 may respectively correspond to a bottom oxide layer, a middle nitride layer, and a top oxide layer, but not limited thereto.

Figure 2:
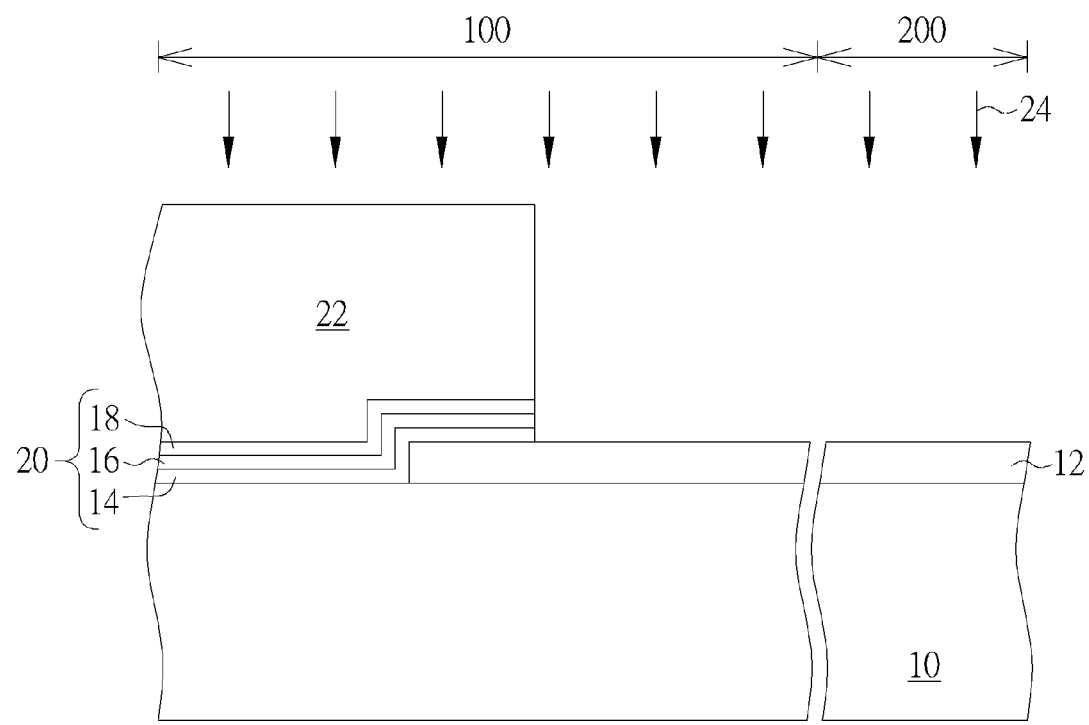
Figure 3:
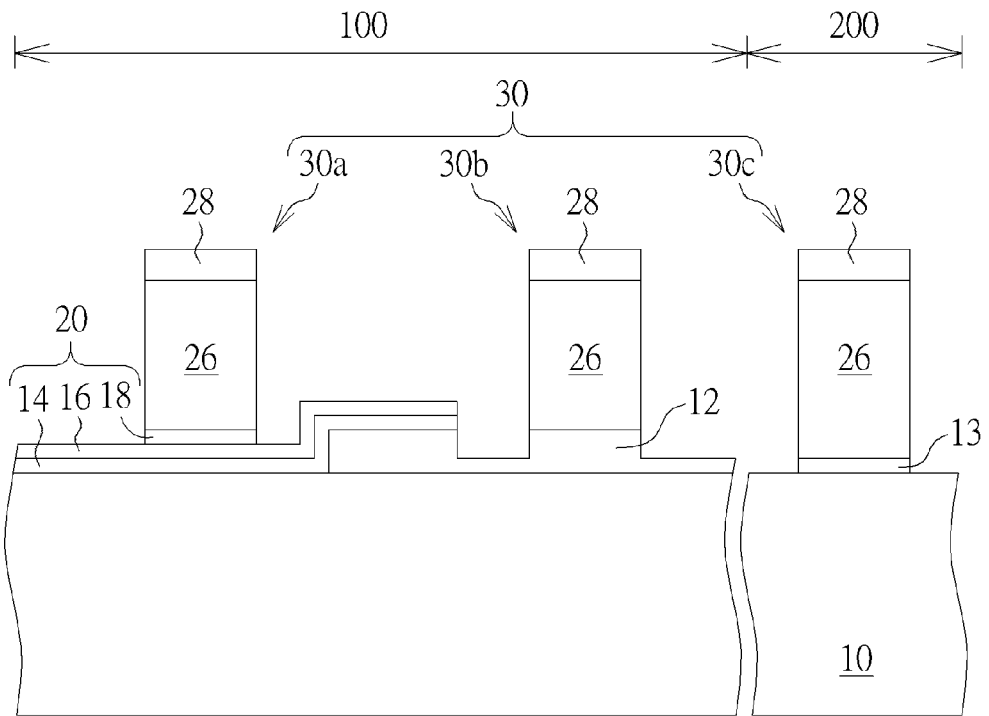

Please refer to FIG. 2. Then, an etching process 24 is carried out by using a patterned mask layer 22, such as photoresist, as an etching mask. Since only portions of the multi-layered dielectric film are covered by the patterned mask layer 22, the multi-layered dielectric film 20 may be patterned through this etching process 24. Precisely, portions of the pad layer 12 within the first region 100 and the entire pad layer 12 within the second region 200 may be exposed from the multi-layered dielectric film 20 by this etching process 24. Due to similar or same material used for the bottom oxide layer and the pad layer 12, the exposed pad layer 12 may be consumed during this etching process.

Then, the patterned mask layer 22 is removed completely and the patterned pad layer 12 may be replaced by a thin dielectric layer (not shown). The thin dielectric layer may serve as a gate dielectric layer in the corresponding semiconductor device, but not limited thereto. Afterwards, referring to FIG. 3, patterned stacks 30 are then formed on the substrate 10 through at least two depositions and an etching process. For example, the patterned stacks 30 may include several patterned stacks, such as a first patterned stack 30a, a second patterned stack 30b, and a third patterned stack 30c. The first patterned stack 30a, the second patterned stack 30b, and the third patterned stack 30c may respectively disposed on the multi-layered dielectric film 20 within the first region 100, on the patterned pad layer 12 within the first region 100, and on the thin dielectric layer 13 within the second region 200. According to the present embodiment, each of the patterned stacks may include a conductive layer 26 and a cap layer 28. The compositions of the conductive layer 26 and the cap layer 28 may be polysilicon and silicon nitride respectively, but not limited thereto. The conductive layer 26 may adopt other forms of silicon materials such as monocrystalline silicon, amorphous silicon and silicon germanium. The cap layer 28 may use oxynitride, silicon carbide or other dielectric materials. It should be noted that the patterned pad layer 12 and the multi-layered dielectric film 20 not covered by the patterned stacks 30 may be removed partially or completely during the formation of the patterned stacks 30. In detail, when the compositions of the top dielectric layer 18 and the patterned pad layer 12 are the same, such as silicon oxides, the top dielectric layer 18 in the exposed edge of the multi-layered dielectric film 20 may be removed completely while the patterned pad layer 12 exposed from the second patterned stack 30b may be removed partially. Besides, the thin dielectric layer 13 within the second region 200 is preferably all covered by the third pattern stack 30b, but not limited thereto.

Figure 4:
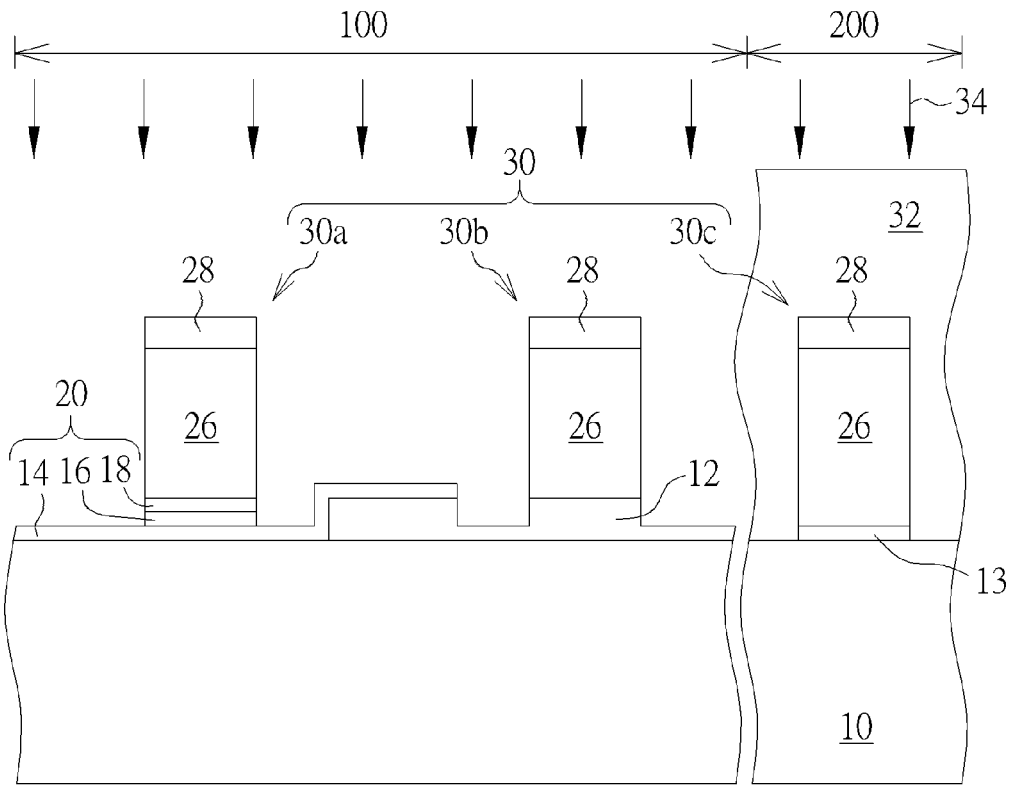

Please refer to FIG. 4. Then, a cover layer 32, such as a photoresist, is formed on the substrate 10 by a photolithographic process. Precisely, since the cover layer 32 is mainly formed within the second region 200, the patterned stacks 30a and 30b within the first region 100 and the exposed edge of the patterned multi-layered dielectric film 20 are exposed from the cover layer 32. After the formation of the cover layer 32, an etching process 34 is carried out by using the cover layer 32 and patterned stacks as etching masks. In this way, the middle electron trapping layer 16 in the exposed edge of the patterned multi-layered dielectric film 20 may be removed completely and the underlying bottom dielectric layer 14 is exposed. It should be noted that, since the middle electron trapping layer 16 has an etching rate greatly higher than that of the bottom dielectric layer 14 and the patterned pad layer 12 during this etching process 34, both the bottom dielectric layer 14 and the patterned pad layer 12 outside the patterned stacks 30 may still remain.

Figure 5:
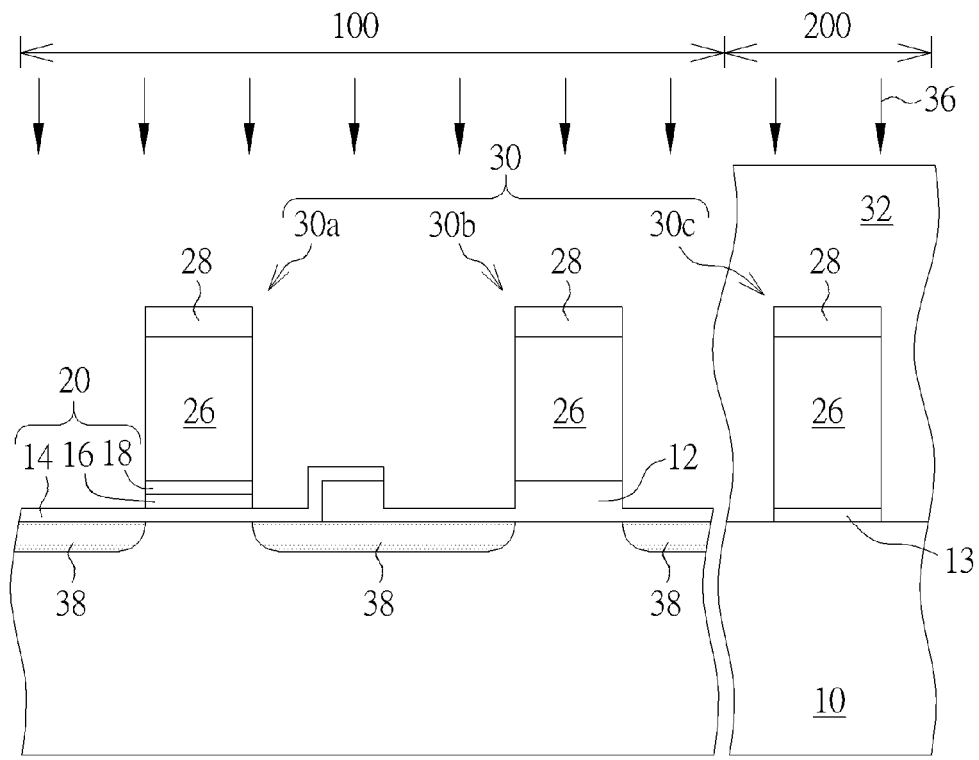
Figure 6:
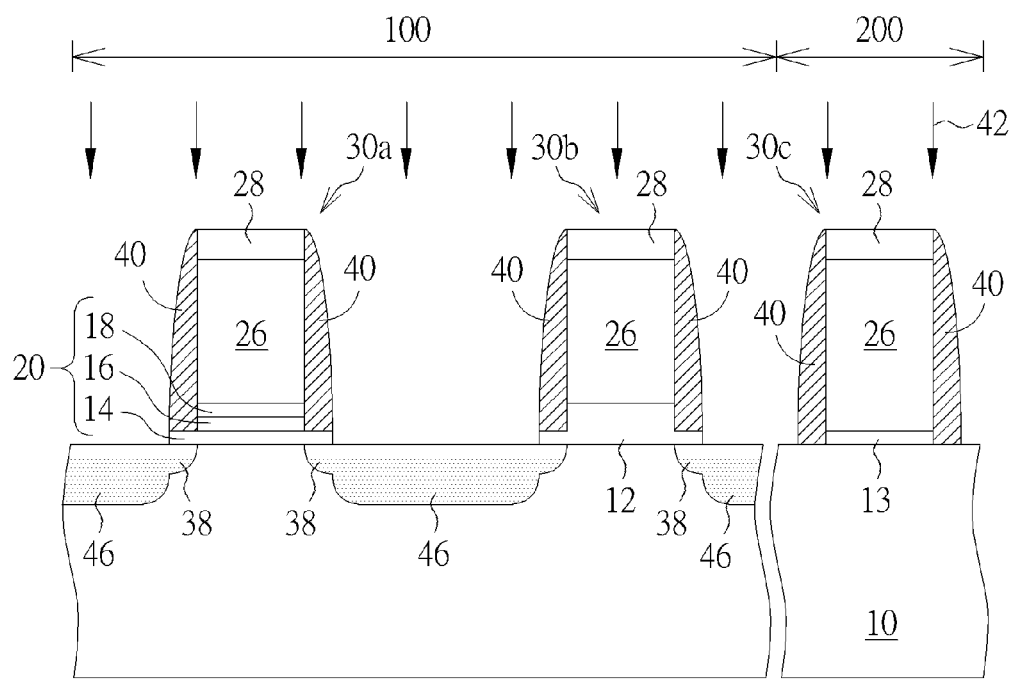

Then, referring to FIG. 5, an ion implantation process 36 is carried out by using the cover layer 32 and the patterned stacks 30 as doping masks. As a result, several doped regions 38, such as lightly doped drain (LDD), are formed at the surface of the substrate 10, especially at the surface of the substrate 10 exposed from the patterned stacks 30a and 30b. It should be noted that the ion implantation process 36 may be a tilt-angle ion implantation so that the doped regions shown in FIG. 5 may be directly formed underneath the patterned stacks 30a and 30b, but not limited thereto. One characteristic of the present embodiment is that the cover layer 32 disclosed herein may serve as both the etch mask and the doping mask. In this way, the middle electron trapping layer 16 may be removed without using additional mask. Besides, dopants from the ion implantation process 36 may be distributed at the surface of the substrate 10 more uniformly since the compositions of the bottom dielectric layer 14 and the patterned pad layer 12 are the same, such as silicon oxides.

Then, the cover layer 32 is removed completely after the ion implantation process. In a next step, referring to FIG. 6, spacers 40 used to define heavily doped regions are respectively formed on the sidewalls of the patterned stacks 30. Preferably, the spacers 40 may be selected from silicon nitride, silicon carbide, silicon carbon nitride, silicon oxynitride or other suitable semiconductor compounds. Subsequently, by performing another implantation process, heavily doped regions 46 are formed at the surface of the substrate 10 and in direct contact with the doped regions 38. Afterwards, an etching process 42 is carried out to remove the patterned pad layer 12 and the bottom dielectric layer 14 exposed from the patterned stacks 30. Since the compositions of the patterned pad layer 12 and the bottom dielectric layer 14 are preferably the same, they are able to be removed through the single etching process 42 with the same etching recipe.

Figure 7:
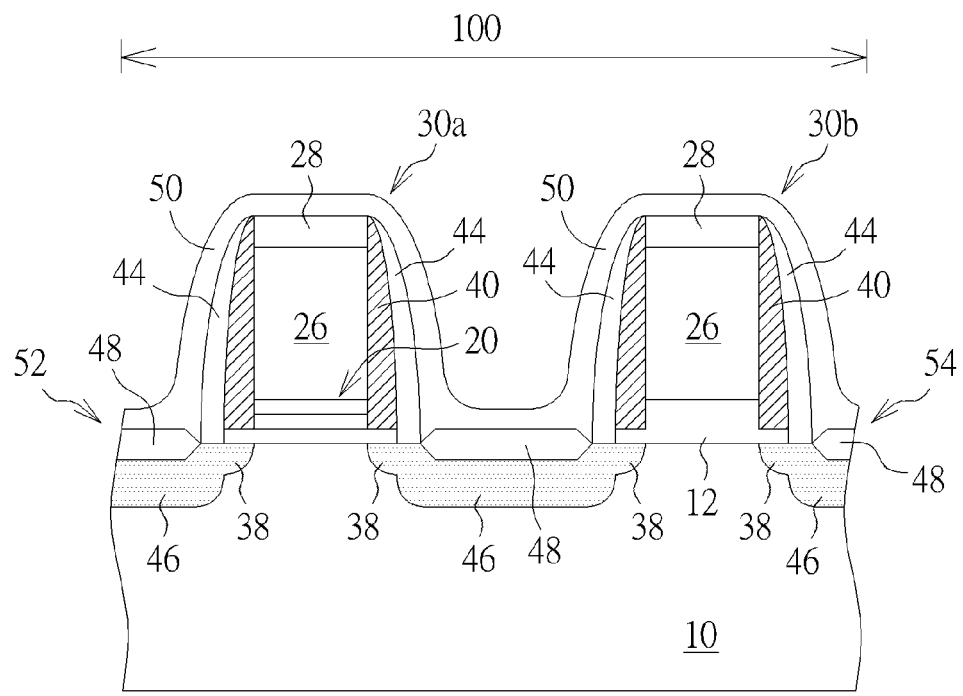

Please refer to FIG. 7. In the following process, metal silicide layers 48 are formed at the surface of the substrate 10, and are especially formed at the surface of the substrate 10 between the first patterned stack 30a and the second patterned stack 30b. Preferably, the metal elements inside the metal silicide layers 48 may be selected from the group consisting of tungsten (W), aluminum (Al), copper (Cu), titanium (Ti), tantalum (Ta), niobium (Nb), erbium (Er), molybdenum (Mo), cobalt (Co), nickel (Ni), platinum (Pt) or alloys of which. Besides, there may be other spacers 44 respectively disposed on the sidewalls of the patterned stacks 30a and 30b. The purpose of the spacers 44 may be to define locations of epitaxial layers (not shown), but not limited thereto. Similarly, the spacers 44 may also be selected from silicon nitride, silicon carbide, silicon carbon nitride, silicon oxynitride or other suitable semiconductor compounds. Besides, an optional contact etch stop layer (CESL) 50 may cover the patterned stacks 30a and 30b and the metal silicides 48 so that it may impose required stress on the channel regions and/or act as a stop layer during a subsequent process for forming a contact structure. Preferably, the contact etch stop layer 50 may be selected from a silicon carbon nitride, a silicon oxynitride, a silicon nitride, a silicon carbide or other suitable semiconductor compounds. It should be noted that the heavily doped regions 46 respectively disposed at sides of the patterned stacks 30a and 30b may serve as source region 52 and drain region 54.

It should be noted that, according to different requirements, epitaxial layers may be optionally formed in the source region and the drain region within the first and/or the second regions before the formation of the metal silicide. In this way, the metal silicide layers may be respectively formed at the surfaces of the epitaxial layers instead of at the surface of the substrate.

Then, after the formation of the metal silicide layers, an interlayer dielectric is formed by a deposition process so that the pattern stacks within the first region are covered. In a next step, by sequentially performing a polishing process and/or an etching process, the upper portion of the interlayer dielectric and the entire cap layers are removed until the top surfaces of the conductive layers are exposed. Afterwards, the conductive layers may be removed completely so as to leave trenches surrounded by the interlayer dielectric.

Figure 8:
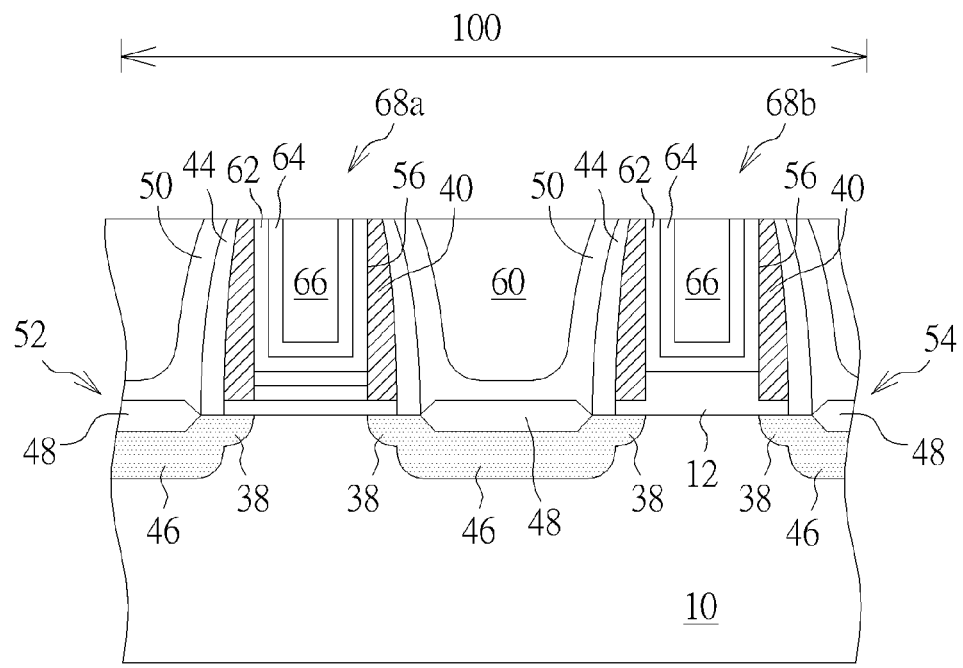

After the above processes, a replacement metal gate (RMG) process may be carried out optionally so as to form a structure shown in FIG. 8. The RMG process may include at least the following steps. Please refer to FIG. 8. After the removal of the conductive layers (not shown), the trenches 56 surrounded by the interlayer dielectric 60 may be formed. Then, an optional dielectric layer 62, a work function metal layer 64, and a conductive material 66 are sequentially filled into the trenches 56. A polishing process is carried out afterwards to remove the conductive material 66, the work function metal layer 64, and the dielectric layer 62 outside the trenches 56. At this time, at least two metal gate structures 68a and 68b, such as control gate and select gate, are obtained and the conductive materials 66 in the metal gate structures 68a and 68b may act as gate electrodes.

The optional dielectric layer 62 is preferably a high-k dielectric layer with a dielectric constant substantially greater than 20. As an example, the dielectric layer 62 could be selected from the group consisting of hafnium oxide ($HfO_2$), hafnium silicon oxide (HfSiO), hafnium silicon oxynitride (HfSiON), aluminum oxide ($Al_2O_3$), lanthanum oxide ($La_2O_3$), lanthanum aluminum oxide (LaAlO), tantalum oxide ($Ta_2O_5$), zirconium oxide ($ZrO_2$), zirconium silicon oxide ($ZrSiO_4$), hafnium zirconium oxide (HfZrO), strontium bismuth tantalite ($SrBi_2Ta_2O_9$, SBT), lead zirconate titanate ($PbZr_xTi_{1-x}O_3$, PZT), and barium strontium titanate ($Ba_xSr_{1-x}TiO_3$, BST), but not limited thereto. Additionally, the work function metal layers include titanium nitride (TiN), titanium carbide, (TiC), tantalum nitride (TaN), tantalum carbide (TaC), tungsten carbide (WC) or aluminum titanium nitride (TiAlN), but not limited thereto. The conductive material 66 may include metal or metal oxide with superior filling ability and relative low resistance, such as aluminum (Al), titanium aluminum (TiAl), titanium aluminum oxide (TiAlO), tungsten (W) or copper (Cu), but not limited thereto.

Figure 9:
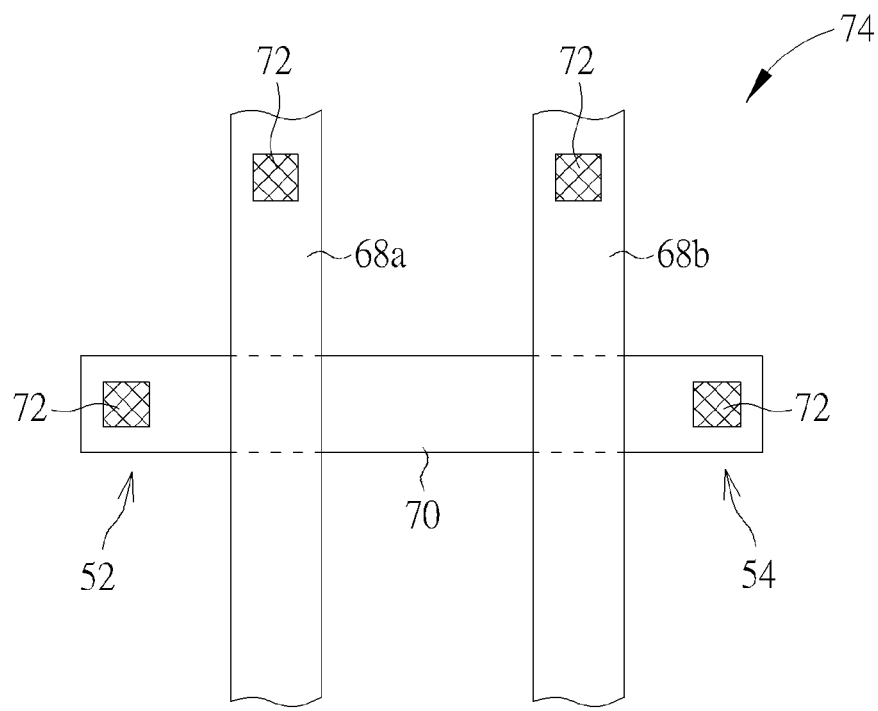

After the above process, another dielectric layer, such as a pre-metal dielectric (PMD), may be formed on the interlayer dielectric and a process for forming contacts may be then carried out. Please refer to FIG. 9. FIG. 9 is a schematic diagram showing a layout of a memory cell according to one embodiment of the present invention. Precisely, a layout shown in FIG. 9 may correspond to a top view of the structure shown in FIG. 8. As shown in FIG. 9, a memory cell 74 includes at least an active region 70 and two stripe-shaped metal gate structures 68a and 68b. The source region 52 and the drain region 54 are respectively at two ends of the active region 70. Precisely, the active region 70 may be intersected by the stripe-shaped metal gate structures 68a and 68b disposed between the source region 52 and the drain region 54. Besides, in order to electrically connect the memory cell 74 to an external circuit, several contact structures 72 are respectively formed in order to contact the source region 52, the drain region 54, and the metal gate structures 68a and 68b. The compositions of the contact structures 72 may be selected from the group consisting of tungsten (W), aluminum (Al), titanium (Ti), copper (Cu), molybdenum (Mo), cobalt (Co), platinum (Pt) or alloys of which, but not limited thereto.

In the following paragraphs, one modification of the first embodiment is disclosed. For the sake of clarity, only the main difference between the modification and the first exemplary embodiment is described, the same or similar processes or structures may refer back to previously described first exemplary embodiment.

Figure 10:
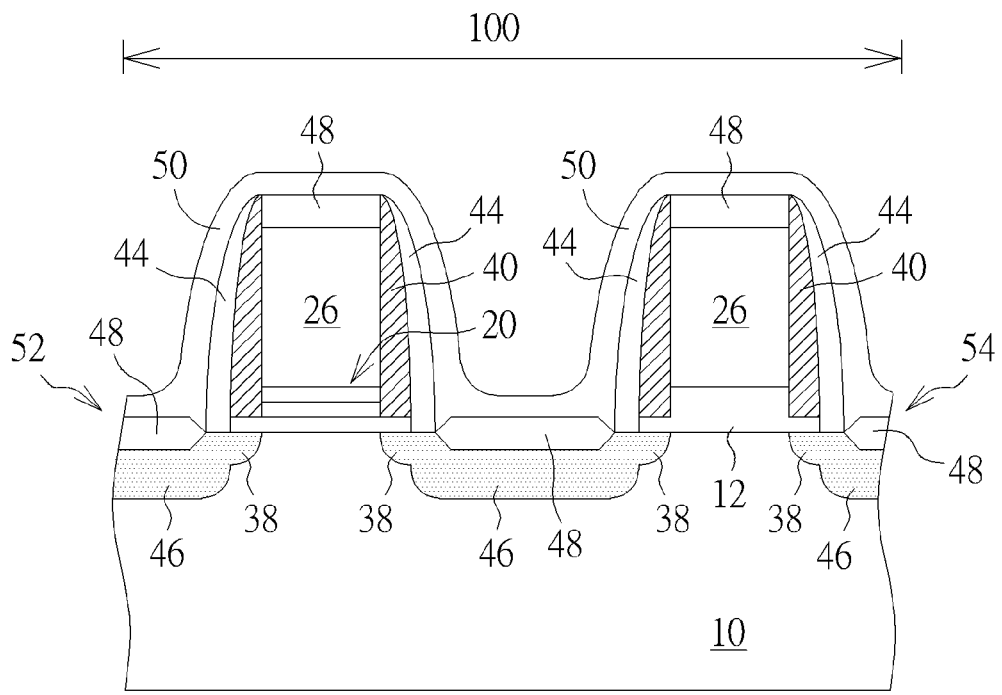
FIG. 10 is a schematic diagram showing a semiconductor device after the formation of metal silicide according to another exemplary embodiment of the present invention.

Please refer to FIG. 10. FIG. 10 is a schematic diagram showing a semiconductor device after the formation of metal silicide layers according to a modification of the present invention. Referring to FIG. 10, the structure shown in FIG. 10 is similar to that shown in FIG. 7. However, one main difference between these two embodiments is that the metal silicide layers 48 are further respectively formed on the top surfaces of the conductive layers 26 according to this modification. In this way, the contacts formed in the following process may be used to electrically connect the metal silicide layers 48 to the external circuit. Since other characteristics and advantages of the present modification are all similar to those described in the first exemplary embodiment, their description is therefore omitted for the sake of clarity.

In summary, the embodiments of the present invention provide a semiconductor device having memory devices. One characteristic of the embodiments is that a part of an exposed edge of a patterned multi-layered dielectric film is removed before the formation of metal silicide layers. In this way, the metal silicide layers may be formed uniformly at the surface of doped regions so as to improve the performance of the semiconductor device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a semiconductor device, comprising:
   forming a patterned multi-layered dielectric film on a substrate;
   forming a patterned stack directly above the patterned multi-layered dielectric film, wherein an edge located at a sidewall of the patterned multi-layered dielectric film is exposed from the patterned stack, wherein the patterned stack comprises an electrically conductive layer;
   forming a cover layer to cover a part of the substrate and expose the patterned stack and the exposed edge of the patterned multi-layered dielectric film;
   removing at least a part of the exposed edge of the patterned multi-layered dielectric film by using the cover layer and the patterned stack as an etching mask;
   performing an ion implantation process by using the cover layer as a mask so as to form a doped region; and
   completely removing the cover layer after performing the ion implantation process.

2. The method according to claim 1, further comprising:
   forming a patterned pad oxide on the substrate; and
   forming the patterned stack on the patterned pad oxide.

3. The method according to claim 1, wherein the patterned multi-layered dielectric film comprises a bottom oxide layer, a middle nitride layer, and a top oxide layer.

4. The method according to claim 3, wherein the bottom oxide layer is exposed after removing the exposed edge of the patterned multi-layered dielectric film.

5. The method according to claim 1, wherein the patterned multi-layered dielectric film comprises an electron trapping layer.

6. The method according to claim 1, wherein a pad oxide is disposed between the substrate and the patterned stack.

7. The method according to claim 1, further comprising completely removing the edge of the patterned multi-layered dielectric film after performing the ion implantation process.

8. The method according to claim 1, further comprising forming a silicide at a surface of the doped region.

9. The method according to claim 1, wherein the patterned stack further comprises a cap layer.

10. The method according to claim 9, further comprising forming a silicide at a top surface of the conductive layer.

11. The method according to claim 1, further comprising:
forming an interlayer dielectric to cover the patterned stack;
removing the interlayer dielectric until the patterned stack is exposed;
removing the patterned stack so as to form at least a trench surrounded by the interlayer dielectric;
sequentially forming a dielectric layer and a work function layer in the trench; and
filling up the trench with a conductive material.

12. The method according to claim 1, wherein the substrate has a first region and a second region, and the method further comprises:
forming the patterned multi-layered dielectric film in the first region of the substrate;
forming the patterned stack on the patterned multi-layered dielectric film and in the first region;
concurrently forming another patterned stack in the second region of the substrate during the step of forming the patterned stack;
forming the cover layer to cover a top of the patterned stack in the second region;
removing at least the part of the exposed edge of the patterned multi-layered dielectric film by using the cover layer in the second region and the patterned stack in the first region as the etching mask.

* * * * *